(12) United States Patent
Wertz, Jr. et al.

(10) Patent No.: US 8,203,084 B2
(45) Date of Patent: Jun. 19, 2012

(54) ELECTRICAL CONNECTOR ASSEMBLY WITH EMI GASKET

(75) Inventors: Robert Harrison Wertz, Jr., Mechanicsburg, PA (US); Matthew Ryan Schmitt, Middletown, PA (US); James Charles Shiffler, Hummelstown, PA (US); Scott P. Drescher, York, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 294 days.

(21) Appl. No.: 12/725,055

(22) Filed: Mar. 16, 2010

(65) Prior Publication Data

US 2011/0226521 A1 Sep. 22, 2011

(51) Int. Cl.
*H05K 9/00* (2006.01)

(52) U.S. Cl. ... 174/368; 174/377; 174/369; 439/607.21; 361/818

(58) Field of Classification Search .................. 174/355, 174/356, 358, 377, 368, 369; 439/607.21, 439/607.18, 607.2; 361/818
See application file for complete search history.

(56) References Cited

U.S. PATENT DOCUMENTS

| | | | | |
|---|---|---|---|---|
| 1,630,675 A | * | 5/1927 | Sinclair | 220/378 |
| 4,841,102 A | * | 6/1989 | Elsner et al. | 174/367 |
| 6,547,252 B1 | * | 4/2003 | Kahl et al. | 277/590 |
| 6,724,641 B1 | * | 4/2004 | Hwang | 361/818 |
| 6,729,905 B1 | * | 5/2004 | Hwang | 439/607.21 |
| 6,731,519 B1 | * | 5/2004 | Hwang | 361/818 |
| 6,878,872 B2 | * | 4/2005 | Lloyd et al. | 174/384 |
| 6,943,287 B2 | * | 9/2005 | Lloyd et al. | 174/359 |
| 7,001,217 B2 | | 2/2006 | Bright et al. | |
| 7,557,306 B2 | | 7/2009 | Chen et al. | |
| 7,591,680 B2 | | 9/2009 | Zhang et al. | |
| 7,612,299 B2 | * | 11/2009 | Chen | 174/359 |
| 2002/0025720 A1 | * | 2/2002 | Bright et al. | 439/607 |
| 2006/0279937 A1 | * | 12/2006 | Manson et al. | 361/724 |

* cited by examiner

*Primary Examiner* — Hung Ngo

(57) ABSTRACT

An electrical connector assembly includes an electrically conductive cage having a cage end configured for mounting in a panel opening. The cage has a compartment for receiving a pluggable electrical component therein. The cage end has a circumference defined by an exterior surface of the cage. A retention frame extends over the cage end along at least a portion of the circumference. The retention frame includes a gasket side and a rear side. A retention opening extends through the gasket and rear sides of the retention frame. An EMI gasket is mounted on the cage end. The EMI gasket includes a length of electrically conductive cord having opposite cord ends. The cord is wrapped externally around the cage end forming a continuous band that engages the exterior surface of the cage along at least a portion of the circumference. The cord extends along and engages the gasket side of the retention frame and the cord ends extend through the retention opening and along the rear side of the retention frame.

20 Claims, 6 Drawing Sheets

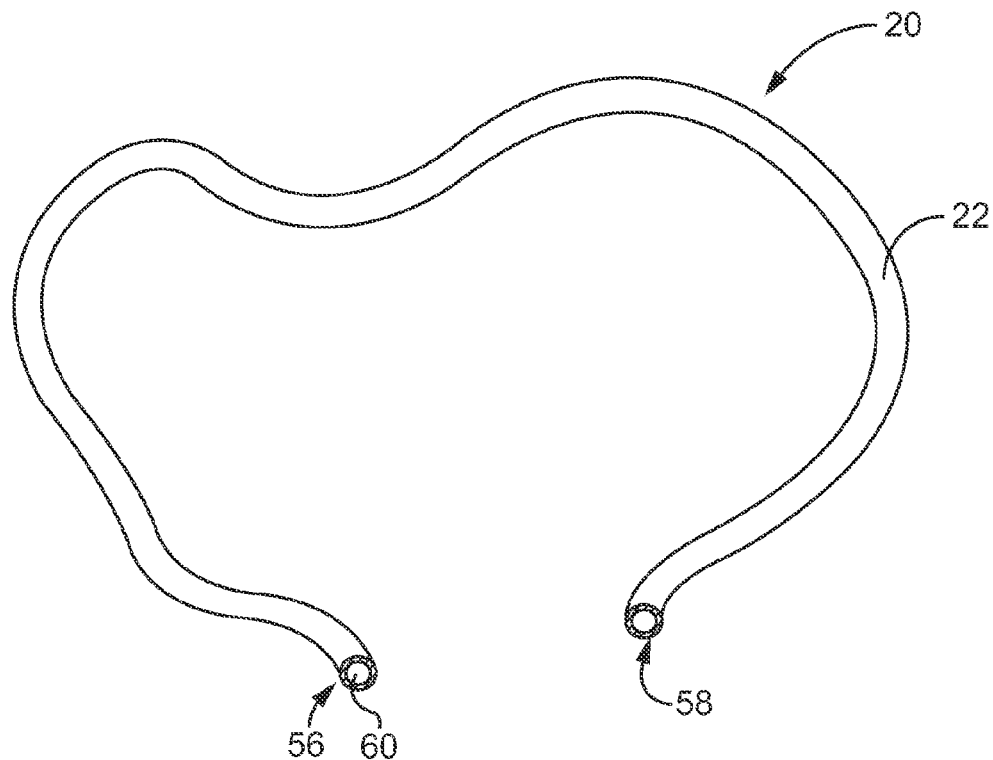
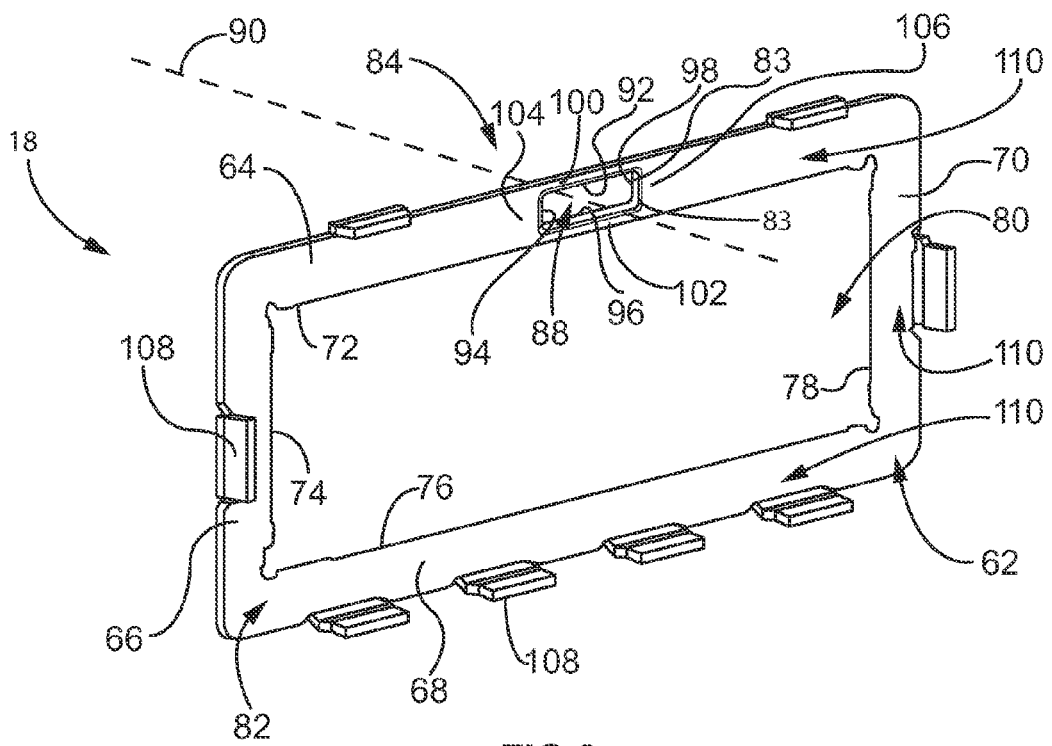

ELECTRICAL CONNECTOR ASSEMBLY WITH EMI GASKET

BACKGROUND OF THE INVENTION

The subject matter described and/or illustrated herein relates generally to electrical connector assemblies, and more particularly, to electrical connector assemblies for pluggable electrical components.

Some known electrical connector assemblies include a metal cage having one or more ports for receiving pluggable electrical components, such as small form factor pluggable (SFP) modules. The ports enable the pluggable electrical components to plug into an electrical connector that is held within the cage and electronically connected to a host circuit board. An end of the cage that includes the ports is typically held within a panel of a housing that contains the host circuit board therein. For example, the housing may be the housing of a computer that includes the host circuit board. An electrically conductive gasket may extend circumferentially around the end of the cage. The gasket is engaged between the panel and the cage and facilitates containing electromagnetic interference (EMI) emissions by grounding the cage to the panel. The gasket is sometimes referred to as an EMI gasket.

Some known EMI gaskets are formed from one or more metal plates that extend around and engage the end of the cage. The metal plates include spring fingers that are bowed outwardly relative to the cage. The spring fingers engage the panel to ground the end of the cage to the panel about the circumference of the end. In an effort to reduce the cost and complexity of such EMI gaskets, some known EMI gaskets are formed from a length of an electrically conductive cord. The cord is wrapped around the end of the cage and includes opposite ends that are connected together using an adhesive such that the cord forms a continuous band around the end of the cage. The cord is often formed from a length of hollow tube that has at least some elasticity to facilitate engagement of the tube with the cage along the circumference of the end of the cage. As described above, the ends of the cord are connected together using an adhesive, which may present one or more disadvantages. For example, the adhesive may increase the cost and/or complexity of the EMI gasket and/or the electrical connector assembly overall. Increased costs may arise, for example, from the cost of the adhesive itself and/or from the difficulty and/or time it takes to connect the ends of the cord together using the adhesive. Containment, drying or curing time, and cleanup are merely some examples of possible disadvantages of adhesive.

BRIEF DESCRIPTION OF THE INVENTION

In one embodiment, an electrical connector assembly includes an electrically conductive cage having a cage end configured for mounting in a panel opening. The cage has a port for receiving a pluggable electrical component therein. The cage end has a circumference defined by an exterior surface of the cage. A retention frame extends over the cage end along at least a portion of the circumference. The retention frame includes a gasket side and a rear side. A retention opening extends through the gasket and rear sides of the retention frame. An electromagnetic interference (EMI) gasket is mounted on the cage end. The EMI gasket includes a length of electrically conductive cord having opposite cord ends. The cord is wrapped externally around the cage end forming a continuous band that engages the exterior surface of the cage along at least a portion of the circumference. The cord extends along and engages the gasket side of the retention frame and the cord ends extend through the retention opening and along the rear side of the retention frame.

In another embodiment, an electrical connector assembly includes an electrically conductive cage having a cage end configured for mounting in a panel opening. The cage has a port for receiving a pluggable electrical component therein. The cage end has a circumference defined by an exterior surface of the cage. An electromagnetic interference (EMI) gasket is mounted on the cage end. The EMI gasket includes a length of electrically conductive cord having opposite cord ends. Openings extend into the cord ends. The cord is wrapped externally around the cage end forming a continuous band that engages the exterior surface of the cage along at least a portion of the circumference. A retention frame extends over the cage end along at least a portion of the circumference. The retention frame includes a gasket side and an arm extending outwardly from the gasket side. Barbs extend outwardly from the arm in opposite directions to free ends. The free ends of the barbs are received in corresponding ones of the openings within the cord ends to connect the cord ends together.

In another embodiment, an electrical connector assembly includes an electrically conductive cage having a cage end configured for mounting in a panel opening. The cage has a port for receiving a pluggable electrical component therein. The cage end has a circumference defined by an exterior surface of the cage. An electromagnetic interference (EMI) gasket is mounted on the cage end. The EMI gasket includes a length of electrically conductive cord having opposite cord ends. Openings extend into the cord ends. The cord is wrapped externally around the cage end forming a continuous band around the cage end. A dowel includes opposite dowel ends received in corresponding ones of the openings of the cord ends to connect the cord ends together.

BRIEF DESCRIPTION OF THE DRAWINGS

FIG. 2 is a perspective view of an exemplary embodiment of an electromagnetic interference (EMI) gasket of the electrical connector assembly shown in FIG. 1.

FIG. 3 is a perspective view of an exemplary embodiment of a retention frame of the electrical connector assembly shown in FIG. 1.

DETAILED DESCRIPTION OF THE INVENTION

Figure 1:
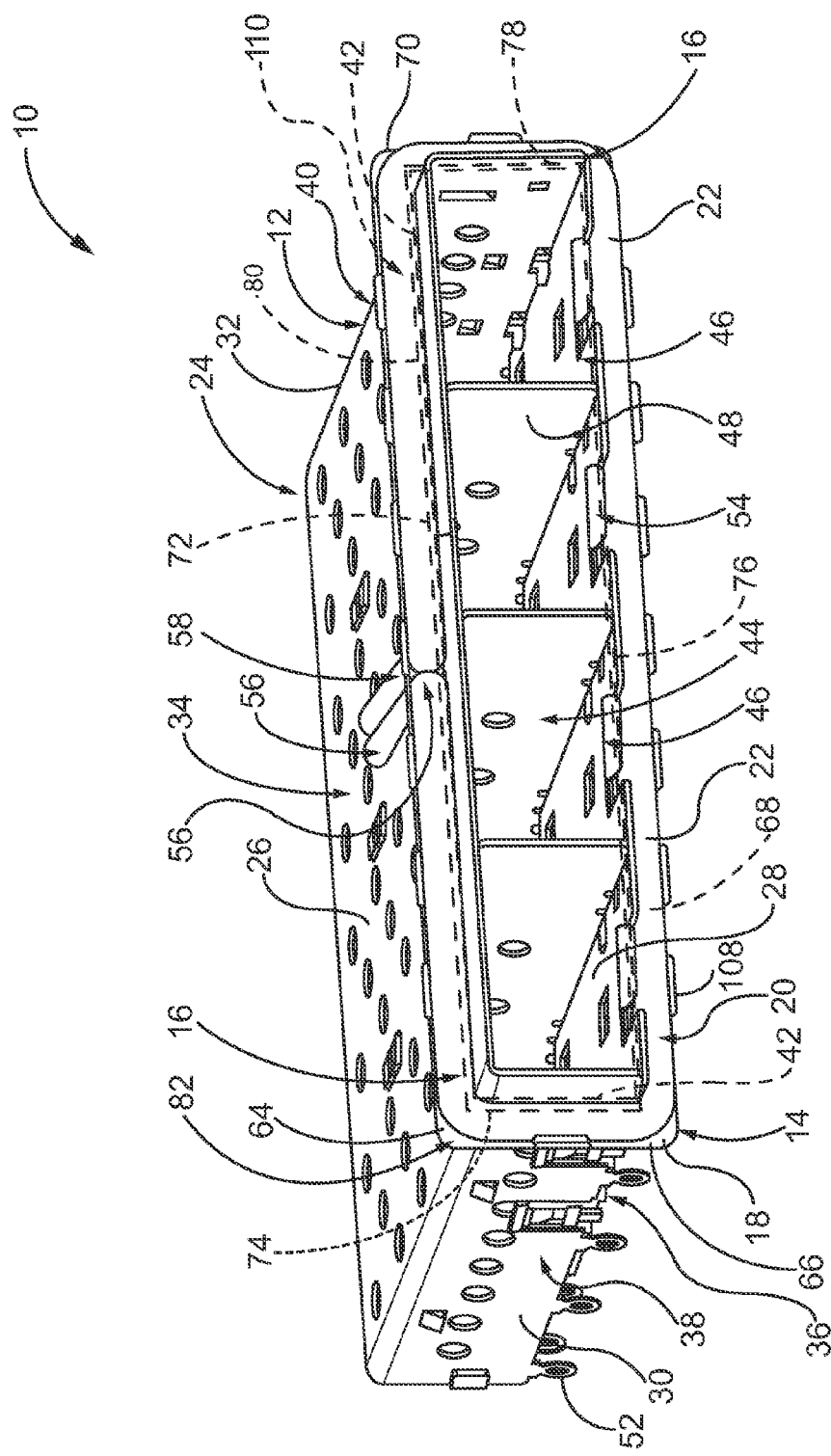
FIG. 1 is a perspective view of an exemplary embodiment of an electrical connector assembly.

FIG. 1 is a perspective view of an exemplary embodiment of an electrical connector assembly 10. The assembly 10 includes an electrically conductive cage 12 having one or more electrical connectors (not shown) positioned therein and an electromagnetic interference (EMI) gasket assembly 14 mounted externally on an end 16 of the cage 12. The assembly 10 is configured to be positioned on a printed circuit (not shown) for electrically connecting one or more pluggable electrical components (not shown), such as, but not limited to, small form-factor pluggable (SFP) modules, to the printed circuit via the electrical connectors. The end 16 of the cage 12 is configured to be mounted, or received, within an opening (not shown) of a panel (not shown) that is adjacent the printed circuit. For example, the panel may be a wall of the housing of a device (not shown), such as, but not limited to, a computer, that includes the printed circuit. In such an example, the electrical connector assembly 10 enables pluggable electrical components located outside the housing to be electrically connected to the printed circuit contained within the housing.

As will be described in more detail below, the EMI gasket assembly 14 includes a retention frame 18 and an EMI gasket 20. The retention frame 18 extends over the end 16 of the cage 12. The EMI gasket 20 includes a length of electrically conductive cord 22 that is mounted on the end 16 of the cage 12. The retention frame 18 engages the EMI gasket 20 to facilitate holding the EMI gasket 20 in position on the end 16 of the cage 12. The EMI gasket 20 facilitates containing electromagnetic interference (EMI) emissions. In some embodiments, ends 56 and 58 of the cord 22 of the EMI gasket 20 extend through a retention opening 88, 188, 288, 388, 488, or 588 (FIGS. 3 and 4, 5, 6, 7, 8, and 9, respectively) of a respective retention frame 18, 118, 218, 318, 418, and 518 to hold the EMI gasket 20 in position on the cage 12. In other embodiments, openings 60 (FIGS. 2, 10, and 11) within the ends 56 and 58 of the cord 22 receive barbs 612 (FIG. 10) or a dowel 712 (FIG. 11) to hold the EMI gasket 20 in position on the cage 12.

The cage 12 extends from the end 16 to an opposite end 24. In the exemplary embodiment, the cage 12 includes a generally parallelepiped shape and includes an upper wall 26, a lower wall 28, and side walls 30 and 32 that extend between the upper and lower walls 26 and 28, respectively. The cage 12 also includes a rear wall (not shown) that extends between the upper and lower walls 26 and 28, respectively, and between the side walls 30 and 32. Each of the walls 26, 28, 30, and 32 includes a respective exterior surface 34, 36, 38, and 40. The end 16 of the cage 12 includes a circumference 42 that is defined by the exterior surfaces 34, 36, 38, and 40. The circumference 42 is illustrated in FIG. 1 by a phantom line that extends around the end 16 of the cage 12. The cage 12 includes an internal chamber 44 that is subdivided into a plurality of ports 46 that extend into the end 16 of the cage 12. The ports 46 are arranged in a row. Specifically, in the exemplary embodiment, the cage 12 includes three divider walls 48 that divide the internal chamber 44 into four ports 46. Each port 46 is configured to at least partially receive one of the pluggable electrical components therein through the end 16 of the cage 12. The electrical connectors are held within corresponding ones of the ports 46 adjacent the end 24 of the cage 12. For each port 46, the cage 12 also includes an opening (not shown) extending through the lower wall 28.

The openings that extend through the lower wall 28 expose mounting interfaces (not shown) of the electrical connectors to enable electrical connection between the electrical connectors and the circuit board through the cage 12.

The cage 12 may have features that ground the cage 12 to the printed circuit. For example, the cage 12 includes a plurality of printed circuit tines 52, which may both mechanically hold and ground the cage 12 to the printed circuit. The upper and/or lower walls 26 and/or 28, respectively, of the cage 12 includes grounding tabs 54 at the end 16 for grounding a pluggable electrical component that is received within the corresponding port 46. The grounding tabs 54 may include latching openings (not shown) for latching the pluggable electrical component within the port 46.

Although the cage 12 is shown as including four ports 46 arranged in a single row, the cage 12 may include any number of ports 46, arranged in any number of rows and/or columns, for receiving any number of pluggable electrical components. Moreover, although shown as having the general shape of a parallelepiped, the cage 12 may include any other shape in addition or alternative to the parallelepiped shape. Each port 46 may include any shape (for receiving any shaped pluggable electrical component) in addition or alternative to the parallelepiped shape shown herein.

FIG. 2 is a perspective view of an exemplary embodiment of the EMI gasket 20. The EMI gasket 20 includes the electrically conductive cord 22, which extends a length from an end 56 to an opposite end 58. In the exemplary embodiment, the cord 22 is a tube such that the cord 22 includes an opening 60 that extends into the ends 56 and 58 and completely through the length of the cord 22 therebetween. The cord 22 is electrically conductive. More specifically, the cord 22 is configured to conduct electricity along the length of the cord 22. The cord 22 may include any materials to provide the electrical conductivity, such as, but not limited to, nickel graphite polymers, silver filled polymers, and/or the like. In some embodiments, the cord 22 has at least some elasticity, for example to facilitate installation of the EMI gasket 20 on the end 16 (FIGS. 1, 4, 6, 7, and 9) of the cage 12 (FIGS. 1, 4, 6, 7, and 9).

Instead of having the opening 60, the cord 22 may alternatively be solid along the entirety of the length of the cord 22. In yet another alternative embodiment, the cord 22 includes openings (not shown) that extend into the ends 56 and 58 but the openings do not communicate with each other such that the cord 22 is solid along at least a portion of the length of the cord 22 between the ends 56 and 58. Although shown as having a generally circular cross-sectional shape, the cord 22 may additionally or alternatively include any other cross-sectional shape, such as, but not limited to, rectangular, square, oval-shaped, a shape having five or more sides, and/or the like.

FIG. 3 is a perspective view of an exemplary embodiment of the retention frame 18. The retention frame 18 includes a body 62 that is optionally electrically conductive. In the exemplary embodiment, the body 62 includes a plurality of wall segments 64, 66, 68, and 70. The wall segments 64, 66, 68, and 70 include respective interior edges 72, 74, 76, and 78 that define a cage opening 80 extending through the body 62 of the retention frame 18. The cage opening 80 is configured to receive the end 16 (FIGS. 1, 4, 6, 7, and 9) of the cage 12 (FIGS. 1, 4, 6, 7, and 9) therein such that the wall segments 64, 66, 68, and 70 extend over the walls 26, 30, 28, and 32 (FIG. 1), respectively, of the cage 12. In the exemplary embodiment, the wall segments 64, 66, 68, and 70 are connected together such that the wall segments 64, 66, 68, and 70 define a frame that extends continuously over the cage end 16 along an approximate entirety of the circumference 42 (FIGS. 1 and 4) of the cage end 16. Specifically, the wall segments 64 and 68 each extend between and interconnect opposite ends of the wall segments 66 and 70. Similarly, the wall segments 66 and 70 each extend between and interconnect opposite ends of the wall segments 64 and 68.

The body 62 of the retention frame 18 includes a gasket side 82 and a rear side 84 that is opposite the gasket side 82. The gasket side 82 is configured to engage the EMI gasket 20 (FIGS. 1, 2, and 4-11) when the gasket assembly 14 (FIGS. 1 and 4) is mounted on the end 16 of the cage 12. The body 62 of the retention frame 18 includes a retention opening 88. As will be described below, the ends 56 and 58 (FIGS. 1, 2, and 4-11) of the cord 22 (FIGS. 1, 2, and 4-11) of the EMI gasket 20 are received through the retention opening 88 to hold the EMI gasket 20 on the cage end 16. The retention opening 88 extends through the gasket side 82 and the rear side 84 and completely through the body 62 therebetween along a central longitudinal axis 90. The retention opening 88 is defined by a plurality of interior edges 92, 94, 96, and 98 of the body 62. The gasket side 82 of the body 62 includes one or more optional chamfers 83 that intersect one or more of the interior edges 92, 94, 96, and/or 98 for guiding reception of the ends 56 and/or 58 of the cord 22 into the retention opening 88. In the exemplary embodiment, the wall segment 64 includes the retention opening 88. But, the retention opening 88 may alternatively be provided within any of the wall segments 66, 68, or 70. Respective upper and lower sub-segments 100 and 102 of the wall segment 64 include the interior edges 92 and 96, while respective side sub-segments 104 and 106 of the wall segment 64 include the interior edges 94 and 98. In some alternative embodiments, the retention opening 88 does not include a portion or all of the upper sub-segment 100 or a portion or all of the lower sub-segment 102, such that the retention opening 88 is open at an upper or lower portion thereof. For example, see FIGS. 6 and 7, which are described below.

Optional tabs 108 extend outwardly from the gasket side 82 of the retention frame body 62. The tabs 108 define an optional channel 110 that is configured to receive the cord 22 (FIGS. 1, 2, and 4-11) of the EMI gasket 20 therein to facilitate holding the EMI gasket 20 in position on the cage end 16. Although eight tabs 108 are shown, the retention frame 18 may include any number of the tabs 108.

Although shown as having a generally rectangular shape defined by four interior edges 92, 94, 96, and 98 and four sub-segments 100, 102, 104, and 106, the retention opening 88 may additionally or alternatively include any other shape, defined by any number of interior edges and/or sub-segments, that enables the retention opening 88 to function as described herein. The body 62 and cage opening 80 of the retention frame 18 are each shown herein as including a generally rectangular shape. But, in addition or alternative to the generally rectangular shape, the body 62 and cage opening 80 may each include any other shape for any shaped cage 12. Although the walls segments 64, 66, 68, and 70 are interconnected as described above, the retention frame body 62 may alternatively be formed from two or more wall segments that are spaced apart from each other along the circumference 42 of the cage end 16. Moreover, in some embodiments the retention frame 18 does not include the wall segments 66, 68, and 70. Although four are shown, the body 62 of the retention frame 18 may include any number of wall segments for extending over any number of walls of the cage 12.

Referring again to FIG. 1, the cage end 16 is received within the cage opening 80 of the retention frame 18 such that the retention frame 18 extends over the cage end 16 along the circumference 42 thereof. Specifically, in the exemplary embodiment, the wall segments 64, 66, 68, and 70 extend over the walls 26, 30, 28, and 32 respectively, of the cage 12. Because the wall segments 64, 66, 68, and 70 are interconnected, the wall segments 64, 66, 68, and 70 define a frame that extends continuously over the cage end 16 along an approximate entirety of the circumference 42. Alternatively, the retention frame 18 extends around only a portion or portions of the circumference 42 of the cage end 16.

One or more of the interior edges 72, 74, 76, and 78 of the retention frame 18 that define the cage opening 80 optionally engages the respective exterior surfaces 34, 36, 38, and 40. When the body 62 of the retention frame 18 is electrically conductive, engagement between the interior edges 72, 74, 76, and/or 78 and the cage 12 electrically connects the retention frame 18 to the cage 12. One or more of the tabs 108 of the retention frame 18 optionally engage the panel (not shown) when the end 16 of the cage 12 is mounted in the panel opening (not shown). The retention frame 18 thereby optionally provides another ground connection between the panel and the cage 12.

The EMI gasket 20 is mounted on the end 16 of the cage 12. The cord 22 of the EMI gasket 20 is wrapped externally around the cage end 16 to form a continuous band that extends along an approximate entirety of the circumference 42 of the cage end 16. Specifically, the cord 22 is wrapped around the bottom wall 28 and the side walls 30 and 32 of the cage 12 at the end 16 such that the cord 22 extends over the walls 28, 30, and 32 at the cage end 16. The ends 56 and 58 of the cord 22 are brought together such that the cord 22 extends over the upper wall 26 of the cage 12 at the end 16 thereof. The cord 22 extends within the channel 110 such that the cord 22 extends along and is engaged with the gasket side 82 of the of the retention frame 18. In the exemplary embodiment, the cord 22 is engaged with the exterior surfaces 34, 36, 38, and 40 of the respective cage walls 26, 28, 30, and 32 along an approximate entirety of the circumference 42 of the cage end 16. Alternatively, the cord 22 is engaged with the cage 12 along only a portion or portions of the circumference 42 of the cage end 16. When the end 16 of the cage 12 is mounted within the panel opening (not shown), the cord 22 is engaged between the panel and the cage 12 and/or between the panel and the retention frame 18 to facilitate containing electromagnetic interference (EMI) emissions by grounding the cage 12 to the panel.

Figure 4:
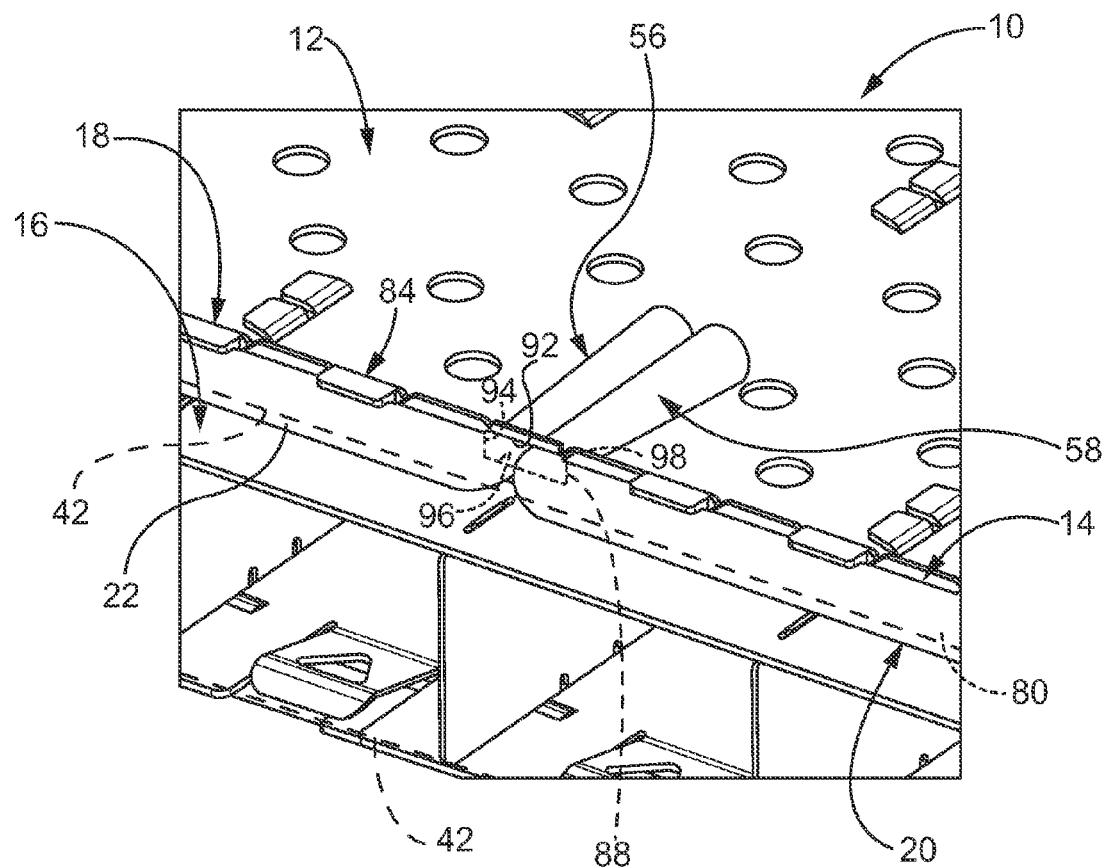
FIG. 4 is an enlarged perspective view of a portion of the electrical connector assembly shown in FIG. 1 illustrating an exemplary embodiment of a method of holding the EMI gasket shown in FIG. 2 on an exemplary embodiment of a cage of the electrical connector assembly.

FIG. 4 is an enlarged perspective view of a portion of the electrical connector assembly 10 illustrating an exemplary embodiment of a method of holding the EMI gasket 20 on the end 16 of the cage 12. As described above, the ends 56 and 58 of the cord 22 of the EMI gasket 20 are brought together when the cord 22 is wrapped around the cage end 16. The cord ends 56 and 58 are received through the retention opening 88 of the retention frame 18 such that the cord ends 56 and 58 extend through the retention opening 88 and along the rear side 84 of the retention frame 18.

Engagement between the cord 22 and the retention frame 18 and/or engagement between the ends 56 and 58 of the cord 22 holds the cord 22 in position on the end 16 of the cage 12. In the exemplary embodiment, the ends 56 and 58 of the cord 22 are engaged with the opposing interior edges 94 and 98, respectively, of the retention opening 88. Each end 56 and 58 is also engaged with the interior edges 92 and 96 of the retention opening 88. Moreover, the ends 56 and 58 of the cord 22 are engaged with each other at the retention opening 88. The ends 56 and 58 of the cord 22 thereby engage the retention frame 18 and each other with an interference fit at the retention opening 88. The interference fit holds the ends 56 and 58 together and holds the cord in position on the end 16 of the cage 12. Optionally, one or both of the ends 56 and 58 of the cord 22 is compressed between the interior edges 92 and 96 and/or between the respective interior edge 94 and 98 and the other end 58 and 56, respectively, as is shown in FIG. 4. The ends 56 and/or 58 may alternatively be engaged with, and/or compressed between, only one or some of the edges 92, 94, 96, and/or 98.

A size and/or shape of the retention opening 88 and/or of the ends 56 and 58 of the cord 22 (such as, but not limited to, a diameter of the cord 22 and/or the like) may be selected to provide the interference fit and/or the compression. Moreover, the retention opening 88 is shown herein as generally having a uniform width along a height of the retention opening 88 and having a uniform height along the width of the retention opening 88. Alternatively, the width of the opening may taper along the height of the retention opening 88, and/or vice versa.

Figure 5:
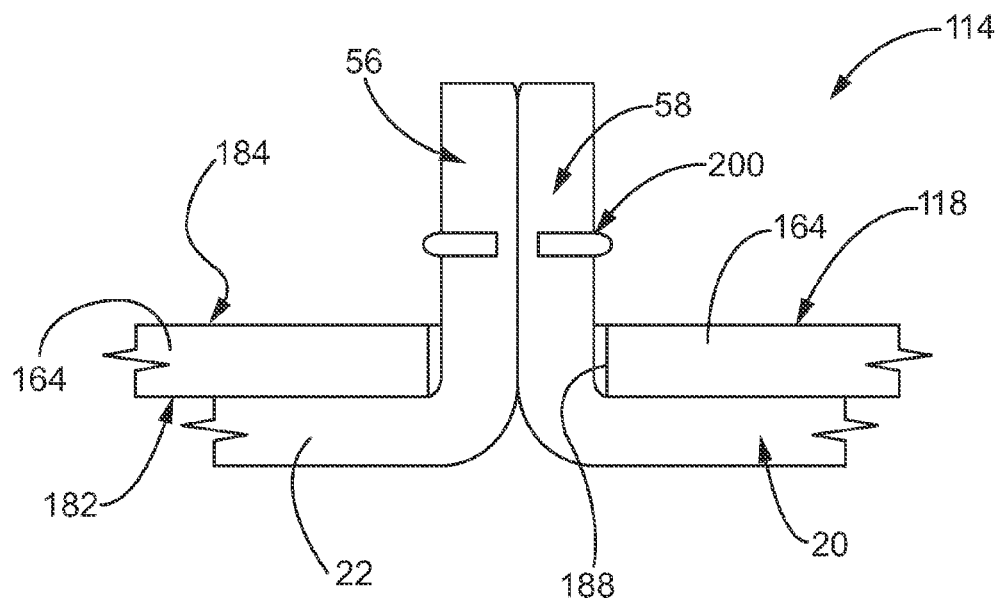
FIG. 5 is a top plan view of a portion of an exemplary alternative embodiment of an EMI gasket assembly of the electrical connector assembly shown in FIG. 1.

In addition or alternative to the engagement between the ends 56 and 58 of the cord 22 of the EMI gasket 20 and the interior edges 92, 94, 96, and/or 98 that define the retention opening 88, the cord ends 56 and/or 58 may be connected together using a mechanical fastener. For example, FIG. 5 is a top plan view of a portion of an exemplary alternative embodiment of an EMI gasket assembly 114. The EMI gasket assembly 114 includes a retention frame 118 having a wall segment 164 that extends over the upper wall 26 (FIGS. 1, 4, 6, 7, and 9) of the cage 12 (FIGS. 1, 4, 6, 7, and 9). The wall segment 164 includes a gasket side 182 and a rear side 184 that is opposite the gasket side 182. A retention opening 188 extends through the gasket and rears sides 182 and 184, respectively, and completely through the wall segment 164 therebetween. The ends 56 and 58 of the cord 22 of the EMI gasket 20 extend through the retention opening 188 and along the rear side 184 of the retention frame 118. A crimp ring 200 extends around the ends 56 and 58 of the cord 22 along the rear side 184 of the retention frame 118. The crimp ring 200 is crimped into engagement with the ends 56 and 58 of the cord 22 to connect the ends 56 and 58 together. As can be seen in FIG. 5, the crimp ring 200 includes at least one dimension that is bigger than at least one dimension of the retention opening 188 such that the ends 56 and 58 cannot be pulled back through the retention opening 188. Accordingly, the crimp ring 200 retains the cord 22 of the EMI gasket 20 in position on the end 16 of the cage 12.

The EMI gasket assembly 114 is not limited to the crimp ring 200. Rather, in addition or alternative to the crimp ring 200, other mechanical fasteners may be used to hold the ends 56 and 58 of the cord 22 together along the rear side 184 of the retention frame 118. Examples of other mechanical fasteners include, but are not limited to, a clip, a staple, a twist-tie, a tie-wrap (sometimes referred to as a "zip tie"), and/or the like.

Figure 6:
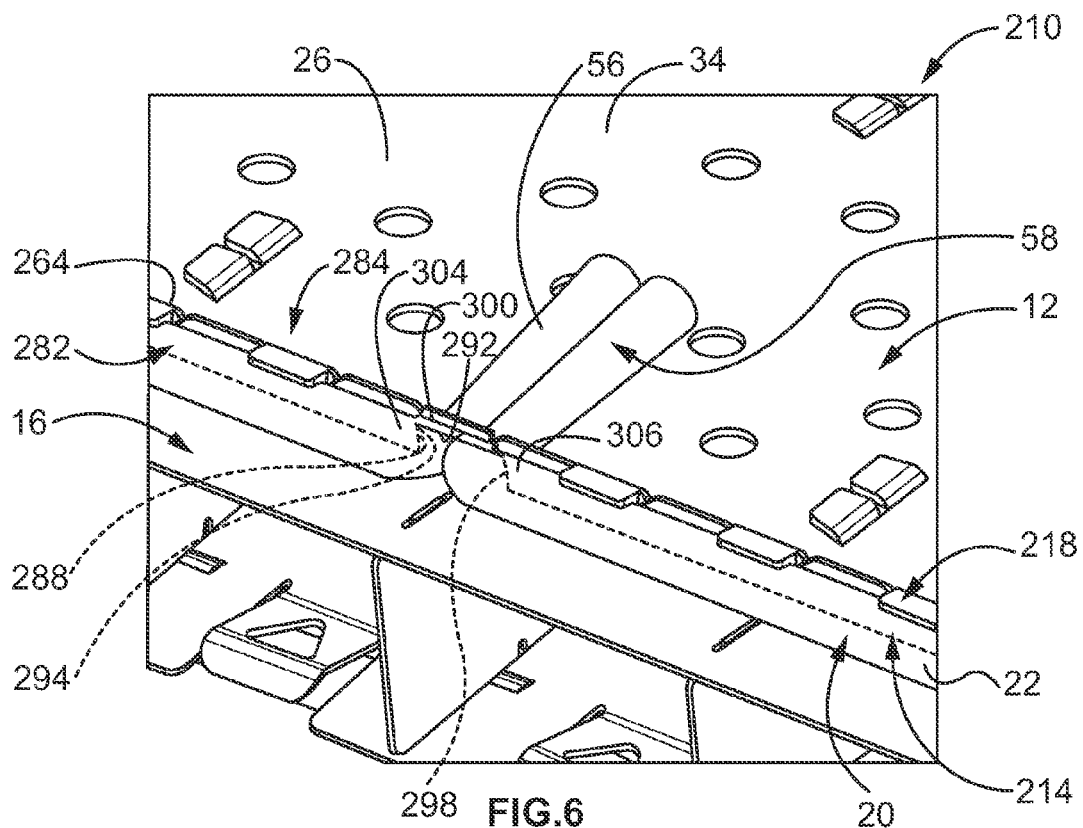
FIG. 6 is a perspective view of a portion of an exemplary alternative embodiment of an electrical connector assembly.

FIG. 6 is a perspective view of a portion of an exemplary alternative embodiment of an electrical connector assembly 210. The electrical connector assembly 210 includes the cage 12 and an EMI gasket assembly 214 mounted on the end 16 of the cage 12. The EMI gasket assembly 214 includes the EMI gasket 20 and a retention frame 218. The retention frame 218 includes a wall segment 264 that extends over the upper wall 26 of the cage 12. The wall segment 264 includes a gasket side 282 and a rear side 284 that is opposite the gasket side 282. A retention opening 288 extends through the gasket side 282 and the rear side 284, and completely through the wall segment 264 therebetween. The retention opening 288 is defined by an upper sub-segment 300 and opposing side sub-segments 304 and 306. The retention frame 218 does not include a lower sub-segment, such that the retention opening 288 is open to the cage wall 26. The upper sub-segment 300 includes an interior edge 292 and the side sub-segments 304 and 306 include respective interior edges 294 and 298.

The ends 56 and 58 of the cord 22 of the EMI gasket 20 extend through the retention opening 288 and along the rear side 284 of the retention frame 218. The ends 56 and 58 of the cord 22 are engaged with the opposing interior edges 294 and 298, respectively, of the retention opening 288. Each end 56 and 58 is also engaged between the interior edge 292 and the exterior surface 34 of the upper wall 26 of the cage. Moreover, the ends 56 and 58 of the cord 22 are engaged with each other at the retention opening 288. The ends 56 and 58 of the cord 22 optionally engage the retention frame 18, the cage 12, and/or each other with an interference fit at the retention opening 288. Optionally, one or both of the ends 56 and 58 of the cord 22 is compressed between the interior edge 292 and the exterior surface 34 and/or between the respective interior edge 294 and 298 and the other end 58 and 56.

Referring again to FIG. 3, in some alternative embodiments, the retention frame 18 includes one or more burrs, barbs, and/or fingers that engage the ends 56 and/or 58 of the cord 22 of the EMI gasket 20. For example, one or more burrs, barbs, and/or fingers (not shown) may extend outwardly from the rear side 84 of the retention frame 18 at and/or proximate any of the interior edges 92, 94, 96, and/or 98. Such burrs, barbs, and/or fingers may each extend, and/or may include one or more segments that extend, approximately parallel, obliquely, or perpendicular to the central longitudinal axis 90 of the retention opening 88.

Figure 7:
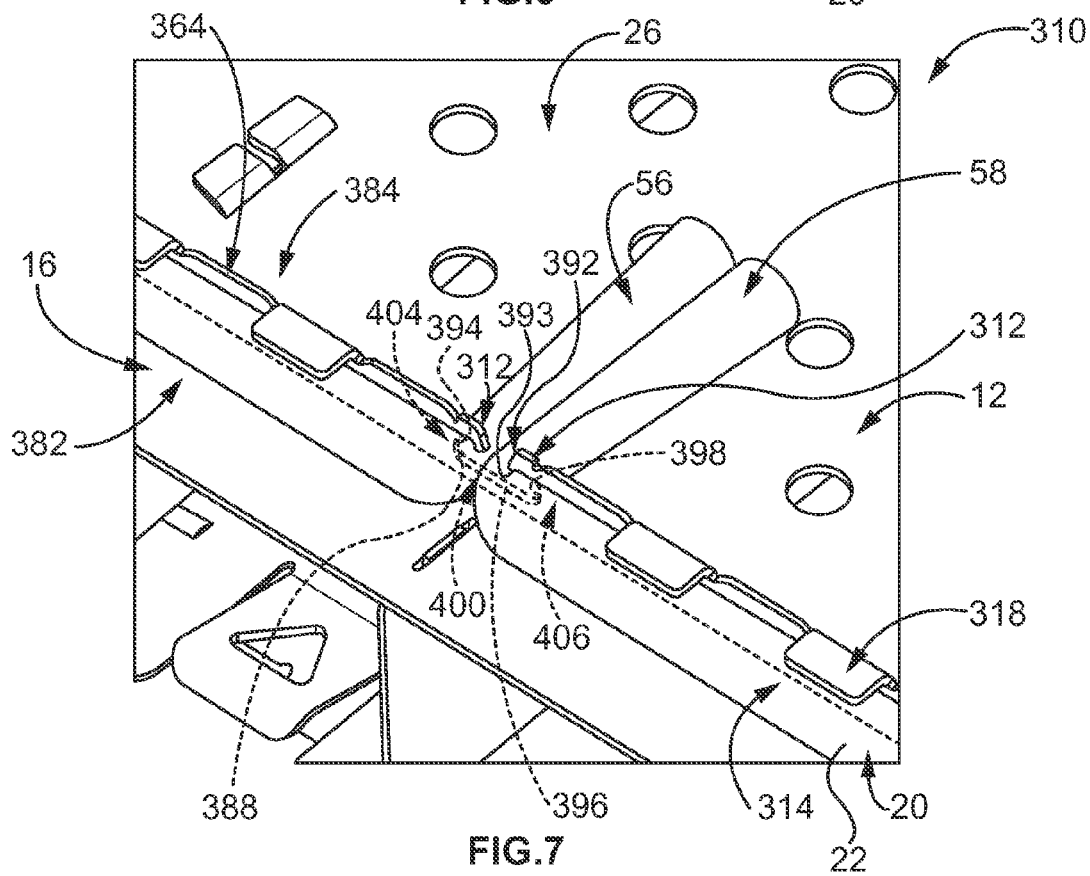
FIG. 7 is a perspective view of a portion of another exemplary alternative embodiment of an electrical connector assembly.

FIG. 7 is a perspective view of a portion of an exemplary alternative embodiment of an electrical connector assembly 310 illustrating an exemplary embodiment of a barb 312. The electrical connector assembly 310 includes the cage 12 and an EMI gasket assembly 314 mounted on the end 16 of the cage 12. The EMI gasket assembly 314 includes the EMI gasket 20 and a retention frame 318. The retention frame 318 includes a wall segment 364 that extends over the upper wall 26 of the cage 12. The wall segment 364 includes a gasket side 382 and a rear side 384 that is opposite the gasket side 382. A retention opening 388 extends through the gasket side 382 and the rear side 384, and completely through the wall segment 364 therebetween. The retention opening 388 is defined by a lower sub-segment 400 and opposing side sub-segments 404 and 406. The retention frame 318 does not include an upper sub-segment. The lower sub-segment 400 includes an interior edge 396 and the side sub-segments 404 and 406 include respective interior edges 394 and 398. A pair of opposing barbs 312 extend outwardly from corresponding ones of the interior edges 394 and 398 into the retention opening 388. Each of the barbs 312 extends from the corresponding edge 394 and 398 to a free end 392. The free ends 392 include optional tip hooks 393.

The ends 56 and 58 of the cord 22 of the EMI gasket 20 extend through the retention opening 388 and along the rear side 384 of the retention frame 318. Each of the barbs 312 engages a corresponding one of the ends 56 and 58 of the cord 22 such that the ends 56 and 58 are engaged between the barbs 312 and the interior edge 396 of the lower sub-segment 400. Specifically, in the exemplary embodiment, each of the tip hooks 393 engages a corresponding one of the ends 56 and 58. Although two are shown, the retention frame 318 may include any number of barbs 312. In some alternative embodiments, the retention frame 318 includes only a single barb 312 that is engaged with both of the ends 56 and 58 of the cord 22.

Figure 8:
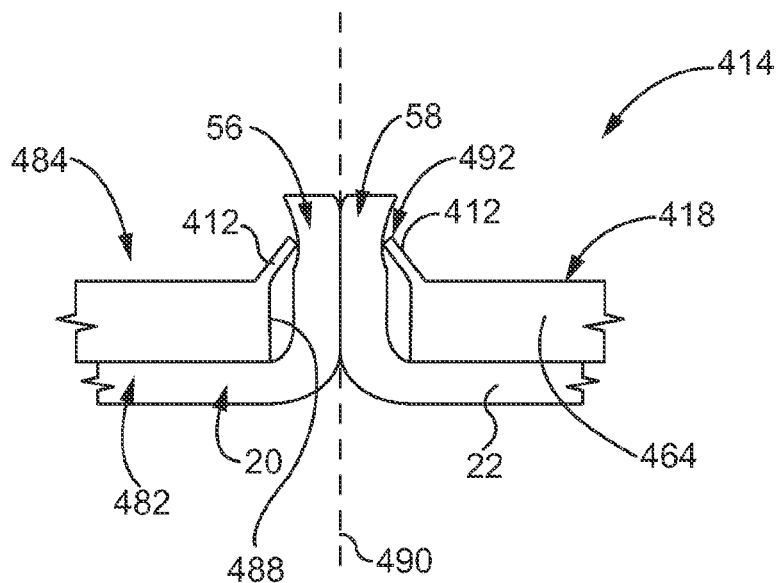
FIG. 8 is a top plan view of a portion of another exemplary alternative embodiment of an EMI gasket assembly of the electrical connector assembly shown in FIG. 1.

FIG. 8 is a top plan view of another exemplary alternative embodiment of an EMI gasket assembly 414. The EMI gasket assembly 414 includes a retention frame 418 having a wall segment 464 that extends over the upper wall 26 (FIGS. 1, 4, 6, 7, and 9) of the cage 12 (FIGS. 1, 4, 6, 7, and 9). The wall segment 464 includes a gasket side 482 and a rear side 484 that is opposite the gasket side 482. A retention opening 488 extends through the wall segment 464 along a central longitudinal axis 490. A pair of opposing fingers 412 extend outwardly from the rear side 484 to free ends 492. As can be seen in FIG. 8, the fingers 412 extend obliquely to, and generally toward, the central longitudinal axis 490 of the retention opening 488. The ends 56 and 58 of the cord 22 of the EMI gasket 20 extend through the retention opening 488 and along the rear side 484 of the retention frame 418. The free end 492 of each of the fingers 412 engages a corresponding one of the ends 56 and 58. Accordingly, the cord ends 56 and 58 are engaged between the free ends 492 of the fingers to hold the EMI gasket 20 in position on the cage end 16 (FIGS. 1, 4, 6, 7, and 9).

Figure 9:
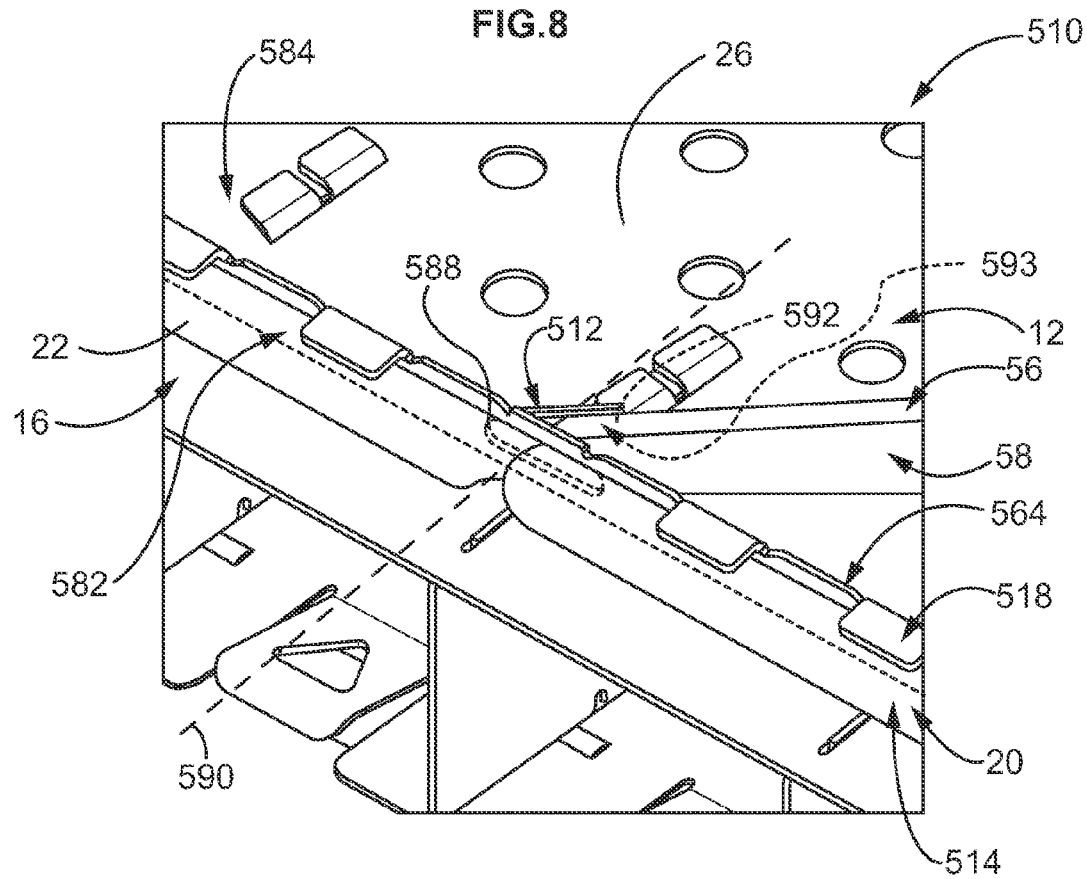
FIG. 9 is a perspective view of another exemplary alternative embodiment of an electrical connector assembly.

FIG. 9 is a perspective view of another exemplary alternative embodiment of an electrical connector assembly 510. The electrical connector assembly 510 includes the cage 12 and an EMI gasket assembly 514 mounted on the end 16 of the cage 12. The EMI gasket assembly 514 includes the EMI gasket 20 and a retention frame 518. The retention frame 518 includes a wall segment 564 that extends over the upper wall 26 of the cage 12. The wall segment 564 includes a gasket side 582 and a rear side 584 that is opposite the gasket side 582. A retention opening 588 extends through the wall segment 564 along a central longitudinal axis 590. A finger 512 extends outwardly from the rear side 584 obliquely to the central longitudinal axis 590 of the retention opening 588. The finger 512 includes an inner surface 592 having a channel 593 defined therein. The channel 593 is optionally shaped complementary with the ends 56 and/or 58 of the cord 22.

The ends 56 and 58 of the cord 22 of the EMI gasket 20 extend through the retention opening 588 and along the rear side 584 of the retention frame 518. The end 56 of the cord 22 is received within the channel 593 and engaged with the inner surface 592 of the finger 512. The finger 512 thereby directs the ends 56 and 58 in a path along the rear side 584 of the wall segment 564 that is oblique to the central longitudinal axis 590 of the retention opening 588. In addition or alternative to the finger 512, the retention frame 518 may include an opposite finger (not shown) that extends outwardly from the rear side 584 of the wall segment 564 and includes a channel (not shown) that receives the end 58 of the cord 22. The channel 593 may have any shape for receiving any shaped cord end. The finger 512 may extend at any oblique angle relative to the central longitudinal axis 590.

Figure 10:
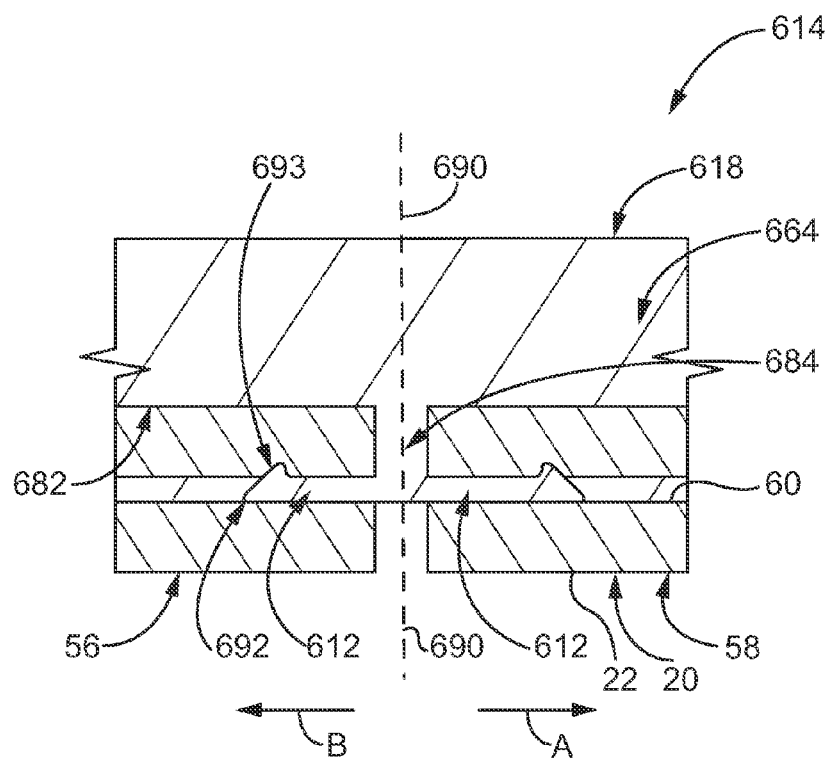
FIG. 10 is a cross sectional view of another exemplary alternative embodiment of an EMI gasket assembly of the electrical connector assembly shown in FIG. 1.

FIG. 10 is a cross sectional view of another exemplary alternative embodiment of an EMI gasket assembly 614. The EMI gasket assembly 614 includes the EMI gasket 20 and a retention frame 618 having a wall segment 664 that extends over the upper wall 26 (FIGS. 1, 4, 6, 7, and 9) of the cage 12 (FIGS. 1, 4, 6, 7, and 9). The wall segment 664 includes a gasket side 682 and an arm 684 extending outwardly from the gasket side 682. The arm 684 extends outwardly from the gasket side 682 along a central longitudinal axis 690. Barbs 612 extend outwardly from the arm 684 in opposite directions. Specifically, the barbs 612 extend outwardly from the arm 684 in opposite directions A and B that are each approximately perpendicular to the central longitudinal axis 690. However each of the barbs 612 may extend in other directions relative to the central longitudinal axis 690. The barbs 612 extend outwardly to free ends 692 that include optional tip hooks 693. The free end 692 of each of the barbs 612 is received within the opening 60 of a corresponding one of the ends 56 and 58 of the cord 22 of the EMI gasket 20 to connect the ends 56 and 58 together and thereby hold the EMI gasket 20 in position on the cage end 16 (FIGS. 1, 4, 6, 7, and 9). In the exemplary embodiment, the tip hooks 693 engage interior surfaces of the cord 22 that define the opening 60 such that the ends 56 and 58 connect to the barbs 612 with an interference fit.

Figure 11:
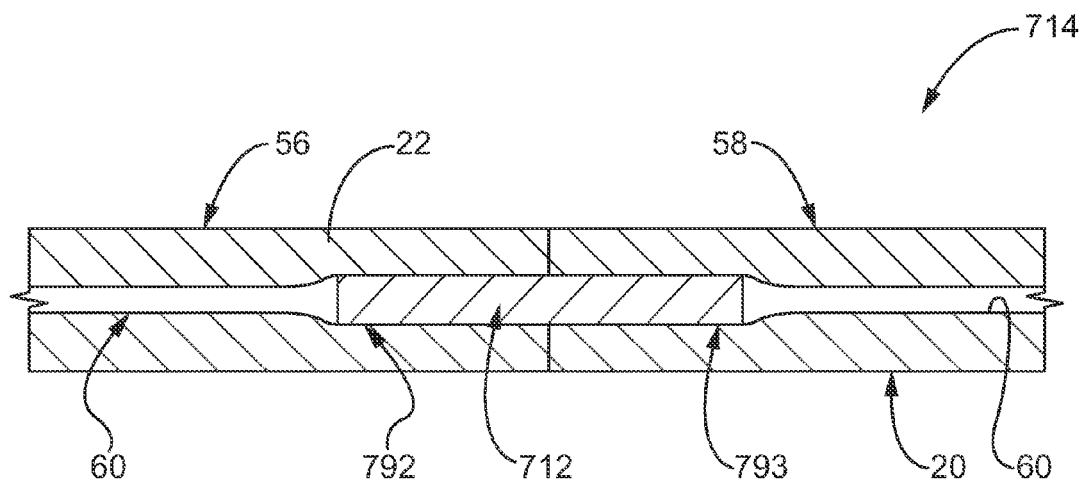
FIG. 11 is another cross sectional view of another exemplary alternative embodiment of an EMI gasket assembly of the electrical connector assembly shown in FIG. 1.

FIG. 11 is another cross sectional view of another exemplary alternative embodiment of an EMI gasket assembly 714. The EMI gasket assembly 714 includes a dowel 712 and the EMI gasket 20. The dowel 712 extends a length from an end 792 to an opposite end 793. As can be seen in FIG. 11, the ends 792 of the dowel 712 are each received within the opening 60 of a corresponding one of the ends 56 and 58 of the cord 22 of the EMI gasket 20. The dowel 712 thereby connects the ends 56 and 58 together to hold the EMI gasket 20 in position on the cage end 16 (FIGS. 1, 4, 6, 7, and 9). In the exemplary embodiment, the dowel ends 792 and 793 engage interior surfaces of the cord 22 that define the opening 60 such that the ends 56 and 58 connect to the dowel 712 with an interference fit.

The EMI gasket assembly 714 optionally includes a retention frame (not shown) having a wall segment (not shown) that extends over the upper wall 26 (FIGS. 1, 4, 6, 7, and 9) of the cage 12 (FIGS. 1, 4, 6, 7, and 9). The EMI gasket 20 may engage a gasket side (not shown) of the wall segment to facilitate holding the EMI gasket 20 in position on the end 16 of the cage 12.

The embodiments described and/or illustrated herein provide an EMI gasket assembly that is less expensive and/or less complex than at least some known EMI gasket assemblies. For example, the embodiments described and/or illustrated herein may provide an EMI gasket assembly that is less difficult and/or takes less time to assemble than at least some known EMI gasket assemblies.

As used herein, the term "printed circuit" is intended to mean any electric circuit in which the conducting connections have been printed or otherwise deposited in predetermined patterns on and/or within an electrically insulating substrate. The substrate may be a flexible substrate or a rigid substrate. The substrate may be fabricated from and/or include any material(s), such as, but not limited to, ceramic, epoxy-glass, polyimide (such as, but not limited to, Kapton® and/or the like), organic material, plastic, polymer, and/or the like. In some embodiments, the substrate is a rigid substrate fabricated from epoxy-glass, which is sometimes referred to as a "circuit board".

It is to be understood that the above description is intended to be illustrative, and not restrictive. For example, the above-described embodiments (and/or aspects thereof) may be used in combination with each other. In addition, many modifications may be made to adapt a particular situation or material to the teachings of the subject matter described and/or illustrated herein without departing from its scope. Dimensions, types of materials, orientations of the various components, and the number and positions of the various components described and/or illustrated herein are intended to define parameters of certain embodiments, and are by no means limiting and are merely exemplary embodiments. Many other embodiments and modifications within the spirit and scope of the claims will be apparent to those of skill in the art upon reviewing the above description and the drawings. The scope of the subject matter described and/or illustrated herein should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. An electrical connector assembly comprising:
    an electrically conductive cage having a cage end configured for mounting in a panel opening, the cage having a port for receiving a pluggable electrical component therein, the cage end having a circumference defined by an exterior surface of the cage;
    a retention frame extending over the cage end along at least a portion of the circumference, the retention frame comprising a gasket side and a rear side, a retention opening extending through the gasket and rear sides of the retention frame; and
    an electromagnetic interference (EMI) gasket mounted on the cage end, the EMI gasket comprising a length of electrically conductive cord having opposite cord ends, the cord being wrapped externally around the cage end forming a continuous band that engages the exterior surface of the cage along at least a portion of the circumference, wherein the cord extends along and engages the gasket side of the retention frame and the cord ends extend through the retention opening and along the rear side of the retention frame.

2. The assembly according to claim 1, wherein the cord ends are engaged with each other and the retention frame at the retention opening of the retention frame.

3. The assembly according to claim 1, wherein the retention frame comprises opposing edges that at least partially define the retention opening, the cord ends being compressed between the edges of the retention frame.

4. The assembly according to claim 1, wherein the cord ends engage the retention frame with an interference fit at the retention opening of the retention frame.

5. The assembly according to claim 1, wherein the retention frame comprises at least one tab that extends outwardly from the gasket side of the retention frame, the at least one tab defining a channel on the gasket side of the retention frame, the cord extending within the channel.

6. The assembly according to claim 1, wherein the retention frame comprises an edge that defines at least a portion of the retention opening, the cord ends being engaged between the edge and the exterior surface of the cage at the retention opening of the retention frame.

7. The assembly according to claim 1, wherein the retention frame comprises an edge that defines at least a portion of the retention opening, a barb extending outwardly from the edge into the retention opening, the barb being engaged with at least one of the cord ends.

8. The assembly according to claim 1, wherein the retention frame comprises opposing edges that at least partially define the retention opening, opposing barbs extend outwardly from the edges toward free ends that oppose each other within the retention opening, the free ends of the barbs comprising tip hooks that are engaged with corresponding ones of the cord ends.

9. The assembly according to claim 1, wherein the retention frame comprises a finger extending outwardly from the rear side, the finger being engaged with at least one of the cord ends.

10. The assembly according to claim 1, wherein the retention opening extends through the retention frame along a central longitudinal axis, the retention frame comprising a finger extending outwardly from the rear side obliquely relative to the central longitudinal axis of the retention opening.

11. The assembly according to claim 1, wherein the retention frame comprise a finger extending outwardly from the rear side, a channel being defined within the finger, the cord ends being held within the channel.

12. The assembly according to claim 1, wherein the retention frame comprises opposing fingers extending outwardly from the rear side to free ends, the cords ends being engaged between the free ends of the fingers.

13. The assembly according to claim 1, wherein the cord ends are connected together using at least one of a clip, a crimp ring, and a staple that is engaged with the cord ends along the rear side of the retention frame.

14. The assembly according to claim 1, wherein the cord comprises a cylindrical tube.

15. An electrical connector assembly comprising:
    an electrically conductive cage having a cage end configured for mounting in a panel opening, the cage having a port for receiving a pluggable electrical component therein, the cage end having a circumference defined by an exterior surface of the cage;
    an electromagnetic interference (EMI) gasket mounted on the cage end, the EMI gasket comprising a length of electrically conductive cord having opposite cord ends, openings extending into the cord ends, the cord being wrapped externally around the cage end forming a continuous band that engages the exterior surface of the cage along at least a portion of the circumference; and
    a retention frame extending over the cage end along at least a portion of the circumference, the retention frame comprising a gasket side and an arm extending outwardly from the gasket side, barbs extend outwardly from the arm in opposite directions to free ends, the free ends of the barbs being received in corresponding ones of the openings within the cord ends to connect the cord ends together.

16. The assembly according to claim 15, wherein the free ends of the barbs are received within the opening of the corresponding cord end with an interference fit.

17. The assembly according to claim 15 wherein the openings within the cord ends fluidly communicate with each other and define a single opening extending continuously through the length of the cord.

18. An electrical connector assembly comprising:
    an electrically conductive cage having a cage end configured for mounting in a panel opening, the cage having a port for receiving a pluggable electrical component therein, the cage end having a circumference defined by an exterior surface of the cage;
    an electromagnetic interference (EMI) gasket mounted on the cage end, the EMI gasket comprising a length of electrically conductive cord having opposite cord ends, openings extending into the cord ends, the cord being wrapped externally around the cage end forming a continuous band around the cage end; and
    a dowel comprising opposite dowel ends received in corresponding ones of the openings of the cord ends to connect the cord ends together.

19. The assembly according to claim 18, wherein the openings within the cord ends fluidly communicate with each other and define a single opening extending continuously through the length of the cord.

20. The assembly according to claim 18, wherein the dowel ends are received within the opening of the corresponding cord end with an interference fit.

* * * * *